(12) United States Patent
Chen et al.

(10) Patent No.: US 12,241,688 B2
(45) Date of Patent: Mar. 4, 2025

(54) VAPOR-PHASE/LIQUID-PHASE FLUID HEAT EXCHANGE UNIT

(71) Applicant: ASIA VITAL COMPONENTS CO., LTD., New Taipei (TW)

(72) Inventors: Chih-Peng Chen, New Taipei (TW); Yu-Min Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 17/078,061

(22) Filed: Oct. 22, 2020

(65) Prior Publication Data

US 2022/0128311 A1    Apr. 28, 2022

(51) Int. Cl.
*F28D 15/02*    (2006.01)
*F28D 15/04*    (2006.01)

(52) U.S. Cl.
CPC ..... *F28D 15/0233* (2013.01); *F28D 15/0266* (2013.01); *F28D 15/043* (2013.01)

(58) Field of Classification Search
CPC .... F28D 15/04; F28D 15/043; F28D 15/0233; F28D 15/0266
See application file for complete search history.

(56) References Cited

U.S. PATENT DOCUMENTS

| | | | | |
|---|---|---|---|---|
| 6,005,772 A * | 12/1999 | Terao | ................ | F28D 15/0266 165/80.4 |
| 6,810,947 B2 * | 11/2004 | Tanaka | ................ | F28F 9/0221 165/104.21 |
| 6,840,310 B2 * | 1/2005 | Tonosaki | ................ | G06F 1/203 174/15.2 |
| 6,863,119 B2 * | 3/2005 | Sugito | ................ | F28F 13/06 165/80.4 |
| 8,345,425 B2 * | 1/2013 | Toyoda | ................ | F28F 1/325 165/80.4 |

(Continued)

FOREIGN PATENT DOCUMENTS

| CN | 1725947 A | 1/2006 |
|---|---|---|
| CN | 1873360 A | 12/2006 |

(Continued)

OTHER PUBLICATIONS

Search Report dated Jan. 13, 2022 issued by Taiwan Intellectual Property Office for counterpart application No. 109133386.

(Continued)

*Primary Examiner* — Raheena R Malik
(74) *Attorney, Agent, or Firm* — Bradley J. Thorson; DeWitt LLP

(57) ABSTRACT

A vapor-phase/liquid-phase fluid heat exchange unit includes: a first cover body having a first and a second side, a vapor outlet and a liquid inlet, the vapor outlet and the liquid inlet being in communication with the first and second sides; and a second cover body having a third and a fourth side, the first and second cover bodies being correspondingly mated with each other to together define a heat exchange space. A working fluid and a fluid separation unit are disposed in the heat exchange space. The fluid separation unit partitions the heat exchange space into an evaporation section corresponding to the vapor outlet and a backflow section corresponding to the liquid inlet.

7 Claims, 15 Drawing Sheets

(56) References Cited

U.S. PATENT DOCUMENTS

| | | | | |
|---|---|---|---|---|
| 8,929,073 | B2* | 1/2015 | Suzuki | H05K 1/0201 |
| | | | | 165/104.21 |
| 9,142,476 | B2* | 9/2015 | Shioga | H01L 21/50 |
| 9,557,117 | B2* | 1/2017 | Yoshikawa | F28F 9/026 |
| 10,989,453 | B2* | 4/2021 | Chen | F28D 7/0066 |
| 11,778,774 | B2* | 10/2023 | Geng | H05K 7/20245 |
| | | | | 165/80.4 |
| 2003/0051860 | A1* | 3/2003 | Montgomery | G06F 1/20 |
| | | | | 165/46 |
| 2005/0092466 | A1* | 5/2005 | Tonosaki | F28D 15/043 |
| | | | | 165/104.21 |
| 2006/0272798 | A1* | 12/2006 | Liu | H01L 23/427 |
| | | | | 165/104.33 |
| 2007/0175613 | A1* | 8/2007 | Li | H01L 23/427 |
| | | | | 165/104.21 |
| 2007/0175615 | A1* | 8/2007 | Li | H01L 23/427 |
| | | | | 257/E23.088 |
| 2009/0044929 | A1* | 2/2009 | Yeh | F28D 15/00 |
| | | | | 165/104.19 |
| 2012/0125586 | A1* | 5/2012 | Chen | H05K 7/20809 |
| | | | | 165/177 |
| 2013/0025826 | A1* | 1/2013 | Sakamoto | H01L 23/427 |
| | | | | 165/104.21 |
| 2016/0227672 | A1 | 8/2016 | Lin | |
| 2016/0245593 | A1* | 8/2016 | Rice | F28D 15/0266 |
| 2018/0209745 | A1* | 7/2018 | Tsai | F28D 15/043 |
| 2019/0331430 | A1* | 10/2019 | Tseng | F28D 15/0283 |
| 2020/0149822 | A1* | 5/2020 | Hsu | F28D 15/0266 |
| 2020/0284523 | A1* | 9/2020 | Wan | F28D 1/0316 |

FOREIGN PATENT DOCUMENTS

| | | |
|---|---|---|
| CN | 101478868 A | 7/2009 |
| CN | 203086911 U | 7/2013 |
| CN | 105452795 A | 3/2016 |
| CN | 106288530 B | 8/2019 |
| CN | 110953914 A | 4/2020 |
| CN | 213073456 U | 4/2021 |
| TW | 201115098 A1 | 5/2011 |
| TW | 201217737 A1 | 5/2012 |
| TW | M605882 | 12/2020 |

OTHER PUBLICATIONS

Search Report dated Dec. 23, 2022 issued by China National Intellectual Property Administration for counterpart application No. 2020110244255, 3 pages.

* cited by examiner

VAPOR-PHASE/LIQUID-PHASE FLUID HEAT EXCHANGE UNIT

BACKGROUND OF THE INVENTION

1. Field of the Invention

The present invention relates generally to a heat exchange unit and a heat exchange module thereof, and more particularly to a vapor-phase/liquid-phase fluid heat exchange unit.

2. Description of the Related Art

It is known that along with the advance of computer technique, the internal electronic components of various electronic devices or computer apparatuses will generate quite high heat in operation. The heat generated by the electronic components must be dissipated in time. Otherwise, the components will be damaged. Therefore, a heat dissipation system is a very important and inevitable design for keeping the electronic components normally working. A conventional heat dissipation design generally employs a cooling fan to provide airflow for forced convection and cooling the electronic components. Alternatively, a special material-made heat dissipation device is attached to the electronic components to conduct the heat and lower the temperature. Also, a water-cooling system is often used as an effective heat dissipation design.

To speak in short, the principle of the water-cooling heat dissipation system is that a liquid (such as water or coolant) is used as a heat dissipation medium and a continuously operated pump is disposed in the water-cooling system to continuously circulate the liquid. The liquid flows within a closed pipeline, which is distributed over the water-cooling system to the surfaces of the respective electronic components (such as a central processing unit). When the liquid with relatively low temperature flows through the electronic component with relatively high temperature, the heat is absorbed by the liquid to lower the temperature of the electronic component. Then, the liquid flows through the pipeline to heat-exchange with external environment or other heat dissipation system so as to release the heat and lower the temperature of the liquid. Thereafter, the liquid flows back into the system to circulate and dissipate the heat. However, it is necessary to arrange a pump in the water-cooling heat dissipation system for driving the liquid to circularly flow. The pump motor has a considerable volume and the internal space of the case of a common electronic device or computer apparatus is limited so that it is hard to arrange the water-cooling heat dissipation system. Moreover, in operation, the pump motor will also generate heat. Therefore, it is necessary to additionally design a heat dissipation system for the pump motor. In general, the liquid in the water-cooling heat dissipation system is used to dissipate the heat of the pump motor. Furthermore, the water-cooling heat dissipation system is subject to leakage problem. Once the leakage of the liquid of the water-cooling heat dissipation system takes place, the internal electronic components of the electronic apparatus will be damaged.

Accordingly, it is hard to design and manufacture the water-cooling heat dissipation system arranged in the smaller and smaller internal space of the electronic apparatus so that the manufacturing cost for the water-cooling heat dissipation system has become higher and higher. It is therefore tried by the applicant to provide a vapor-phase/liquid-phase fluid heat exchange unit to solve the above problems existing in the conventional water-cooling heat dissipation system.

SUMMARY OF THE INVENTION

It is therefore a primary object of the present invention to provide a vapor-phase/liquid-phase fluid heat exchange unit, in which the conventional motor is omitted so that the volume of the heat exchange unit and the heat dissipation device is minified for easy installation in an electronic device and lowering the design and manufacturing cost.

To achieve the above and other objects, the vapor-phase/liquid-phase fluid heat exchange unit of the present invention includes: a first cover body having a first side, a second side, a vapor outlet and a liquid inlet, the vapor outlet and the liquid inlet being separated from each other in communication with the first and second sides; a second cover body having a third side and a fourth side, the first and second cover bodies being correspondingly mated with each other to together define a heat exchange space in which a working fluid is filled; and a fluid separation unit disposed in the heat exchange space to partition the heat exchange space into an evaporation section corresponding to the vapor outlet and a backflow section corresponding to the liquid inlet.

Still to achieve the above and other objects, the vapor-phase/liquid-phase fluid heat exchange device of the present invention includes a vapor-phase/liquid-phase fluid heat exchange unit and a heat dissipation device. The vapor-phase/liquid-phase fluid heat exchange unit includes: a first cover body having a first side, a second side, a vapor outlet and a liquid inlet, the vapor outlet and the liquid inlet being separated from each other in communication with the first and second sides; a second cover body having a third side and a fourth side, the first and second cover bodies being correspondingly mated with each other to together define a heat exchange space in which a working fluid is filled; and a fluid separation unit disposed in the heat exchange space to partition the heat exchange space into an evaporation section corresponding to the vapor outlet and a backflow section corresponding to the liquid inlet. The heat dissipation device has a heat dissipation device outlet and a heat dissipation device inlet. The vapor outlet is in communication with the heat dissipation device inlet via a first tube body. The liquid inlet is in communication with the heat dissipation device outlet via a second tube body.

By means of the design of the present invention, the working fluid can be driven to circulate without using any motor. Therefore, the volumes of the heat exchange unit and the heat exchange module are minified and the design and manufacturing cost for the heat exchange unit and the heat exchange module is lowered.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
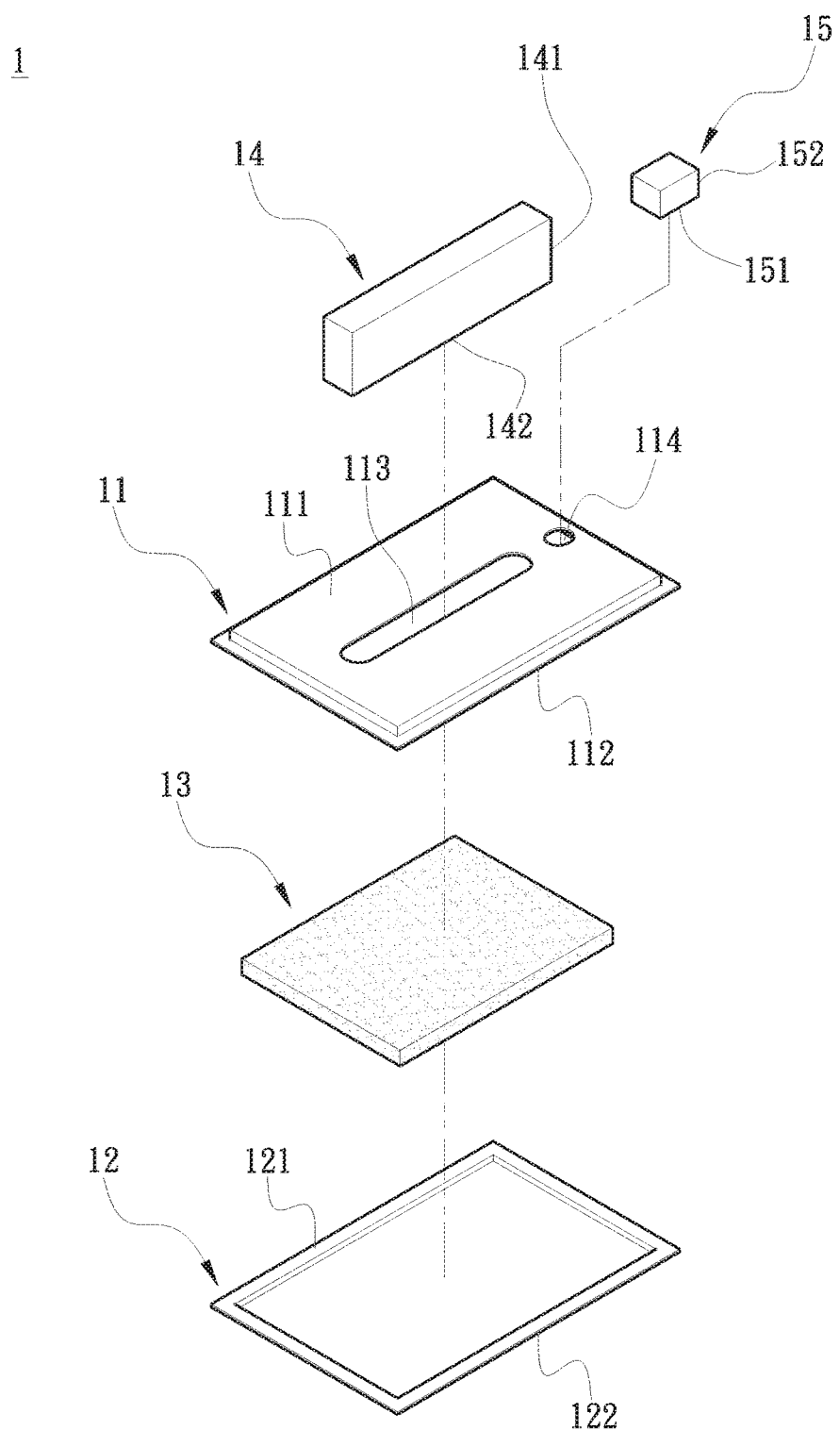
FIG. 1 is a perspective exploded view of a first embodiment of the vapor-phase/liquid-phase fluid heat exchange unit of the present invention.
Figure 2:
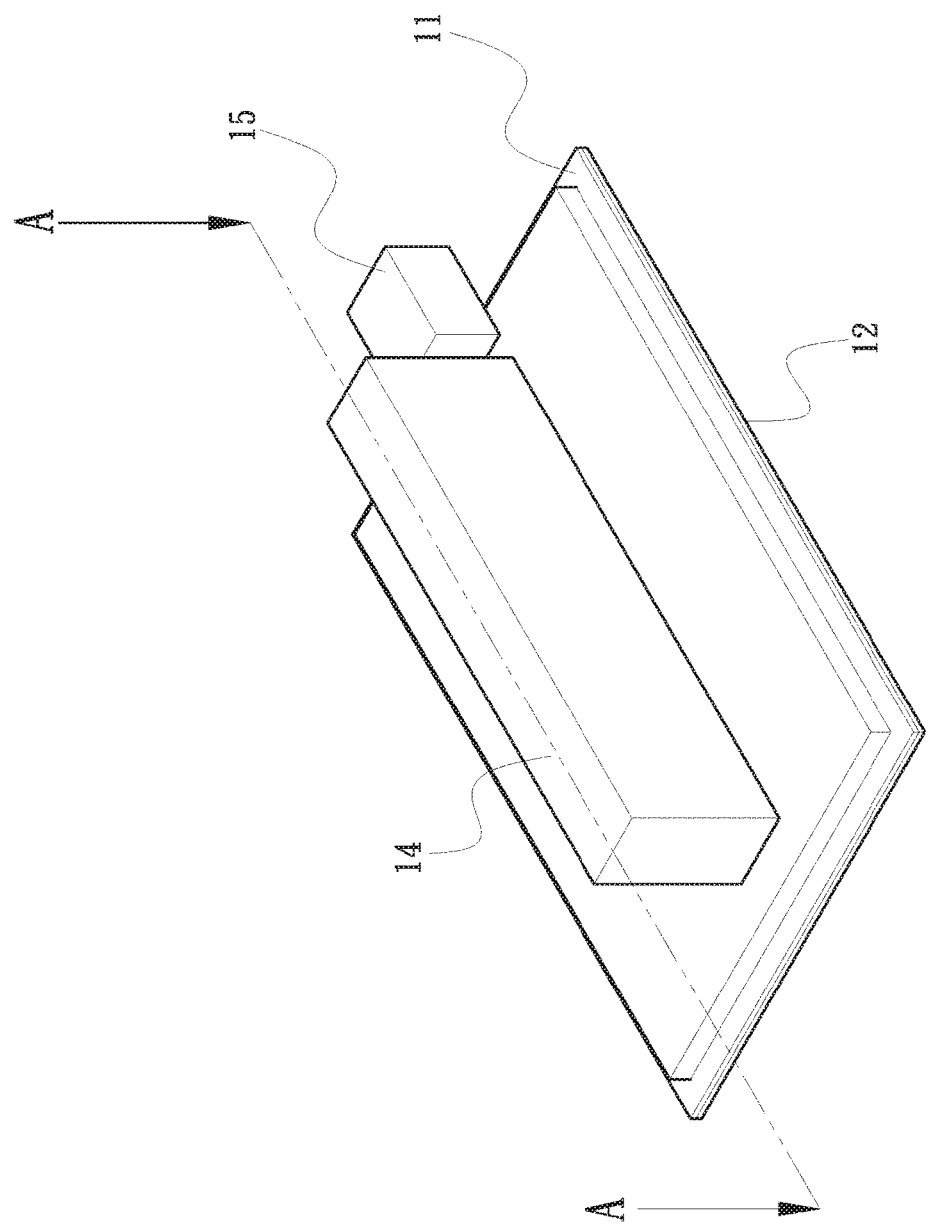
FIG. 2 is a perspective assembled view of the first embodiment of the vapor-phase/liquid-phase fluid heat exchange unit of the present invention.
Figure 3:
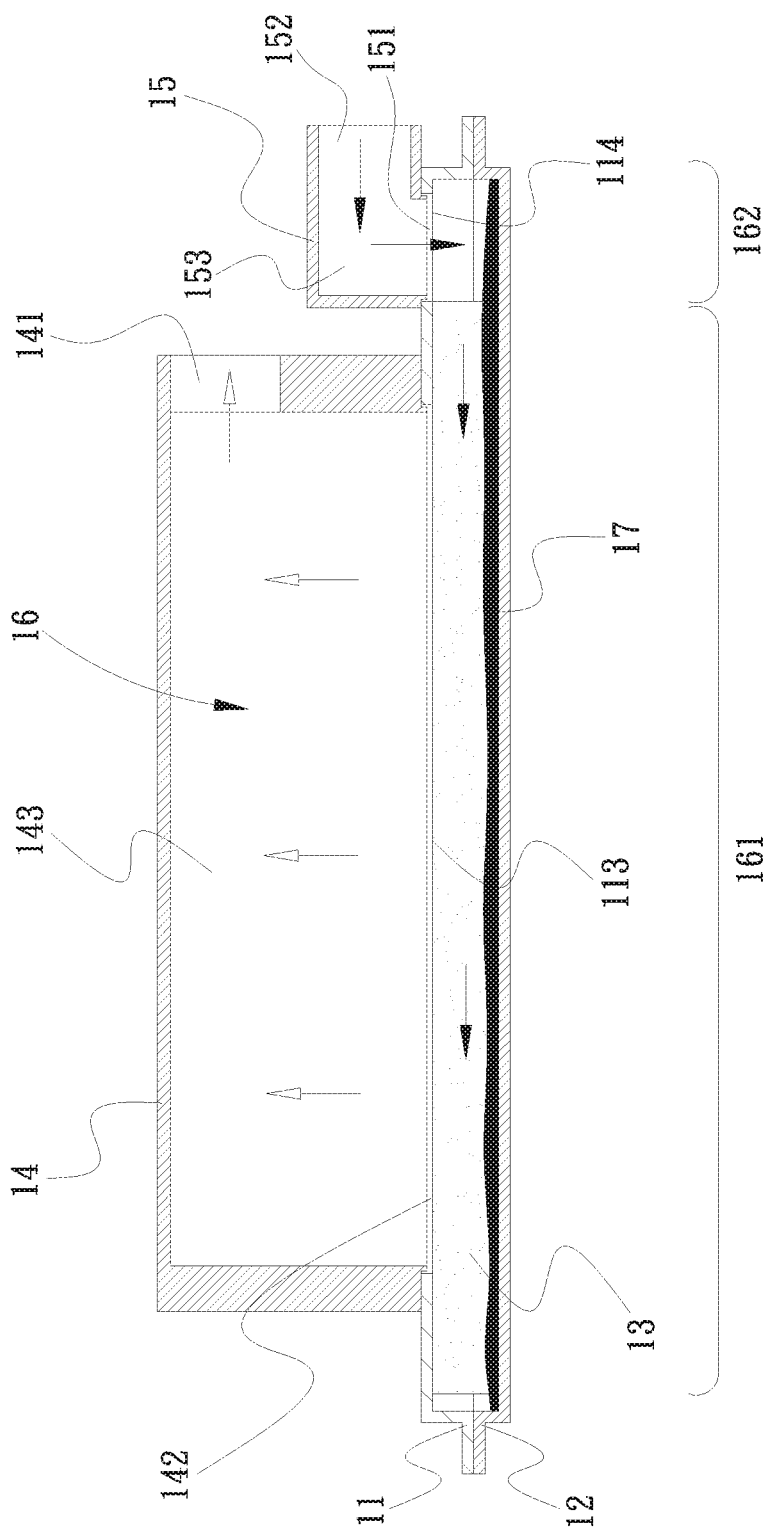
FIG. 3 is a sectional view of the vapor-phase/liquid-phase fluid heat exchange unit of the present invention, taken along line A-A of FIG. 2.

Please refer to FIGS. 1, 2 and 3. FIG. 1 is a perspective exploded view of a first embodiment of the vapor-phase/liquid-phase fluid heat exchange unit of the present invention. FIG. 2 is a perspective assembled view of the first embodiment of the vapor-phase/liquid-phase fluid heat exchange unit of the present invention. FIG. 3 is a sectional view of the vapor-phase/liquid-phase fluid heat exchange unit of the present invention, taken along line A-A of FIG. 2. As shown in the drawings, the vapor-phase/liquid-phase fluid heat exchange unit 1 of the present invention includes a first cover body 11, a second cover body 12, a fluid separation unit 13, a first connector 14 and a second connector 15. In practice, the vapor-phase/liquid-phase fluid heat exchange unit 1 is attached to a heat generation component (not shown).

The first cover body 11 has a first side 111, a second side 112, a vapor outlet 113 and a liquid inlet 114. The first and second sides 111, 112 are respectively positioned on upper and lower sides of the first cover body 11. The vapor outlet 113 and the liquid inlet 114 are separated from each other in communication with the first and second sides 111, 112.

The second cover body 12 has a third side 121 and a fourth side 122. The third and fourth sides 121, 122 are respectively positioned on upper and lower sides of the second cover body 12. The first and second cover bodies 11, 12 are correspondingly mated with each other to together define a heat exchange space 16 in which a working fluid 17 is filled.

The fluid separation unit 13 is disposed in the heat exchange space 16 to divide (partition) the heat exchange space 16 into an evaporation section 161 corresponding to the vapor outlet 113 and a backflow section 162 corresponding to the liquid inlet 114. After evaporating at the evaporation section 161, the working fluid 17 flows out from the vapor outlet 113 to condense in an external environment. Then the working fluid 17 flows into the backflow section 162 from the liquid inlet 114. Then the working fluid 17 flows back to the evaporation section 161 from the backflow section 162.

In the present invention, the fluid separation unit 13 can be a capillary structure for separating the vapor outlet 113 and the liquid inlet 114. The capillary structure serves to speed the backflow of the condensed working fluid 17 to the evaporation section 161. When the fourth side 122 of the second cover body 12 is attached to a heat generation component, the working fluid 17 is heated and evaporated. The evaporation section 161 and the backflow section 162 are separated by the fluid separation unit 13 so that the evaporated working fluid 17 is prevented from blocking the liquid inlet 114 or reversely flowing into the liquid inlet 114.

The first connector 14 is connected with the first cover body 11 or integrally formed with the first cover body 11. The first connector 14 has a first outlet 141, a first inlet 142 and a vapor outgoing chamber 143. The first outlet 141 and the first inlet 142 are respectively in communication with the vapor outgoing chamber 143. The first inlet 142 is correspondingly in communication with the vapor outlet 113. In a modified embodiment, the first connector 14 further has a gas-exhausting/water-filling opening (not shown) in communication with the vapor outgoing chamber 143. The working fluid 17, which can be converted between vapor phase and liquid phase, is filled in through the gas-exhausting/water-filling opening and the non-condensed gas inside the vapor-phase/liquid-phase fluid heat exchange unit 1 is sucked out and removed through the gas-exhausting/water-filling opening. After the gas is removed and the working fluid 17 is filled in, the gas-exhausting/water-filling opening is sealed. The working fluid 17 is such as pure water or methanol.

The second connector 15 is connected with the first cover body 11 or integrally formed with the first cover body 11. The second connector 15 has a second outlet 151, a second inlet 152 and a backflow chamber 153. The second outlet 151 and the second inlet 152 are respectively in communication with the backflow chamber 153. The second outlet 151 is correspondingly in communication with the liquid inlet 114.

In a modified embodiment, the first and second connectors 14, 15 are omitted and the tube bodies are directly connected at the vapor outlet 113 and the liquid inlet 114 of the first cover body 11.

By means of the design of the present invention, after the working fluid 17 at the evaporation section 161 is heated and evaporated (as shown by the hollow arrows of FIG. 3), the first cover body 11 provides vapor collection effect. The evaporated working fluid 17 will be driven to a position with smaller pressure so that the evaporated working fluid 17 will be driven to the vapor outgoing chamber 143 of the first connector 14 to flow out from the first outlet 141. Reversely, the condensed working fluid 17 is continuously driven by the evaporated working fluid 17 to flow into the backflow chamber 153 from the second inlet 152 of the second connector 15 and further flow into the backflow section 162. Therefore, the working fluid can be driven to circulate without using any motor so that the volume of the heat exchange unit can be minified and the design and manufacturing cost is lowered.

Figure 4:
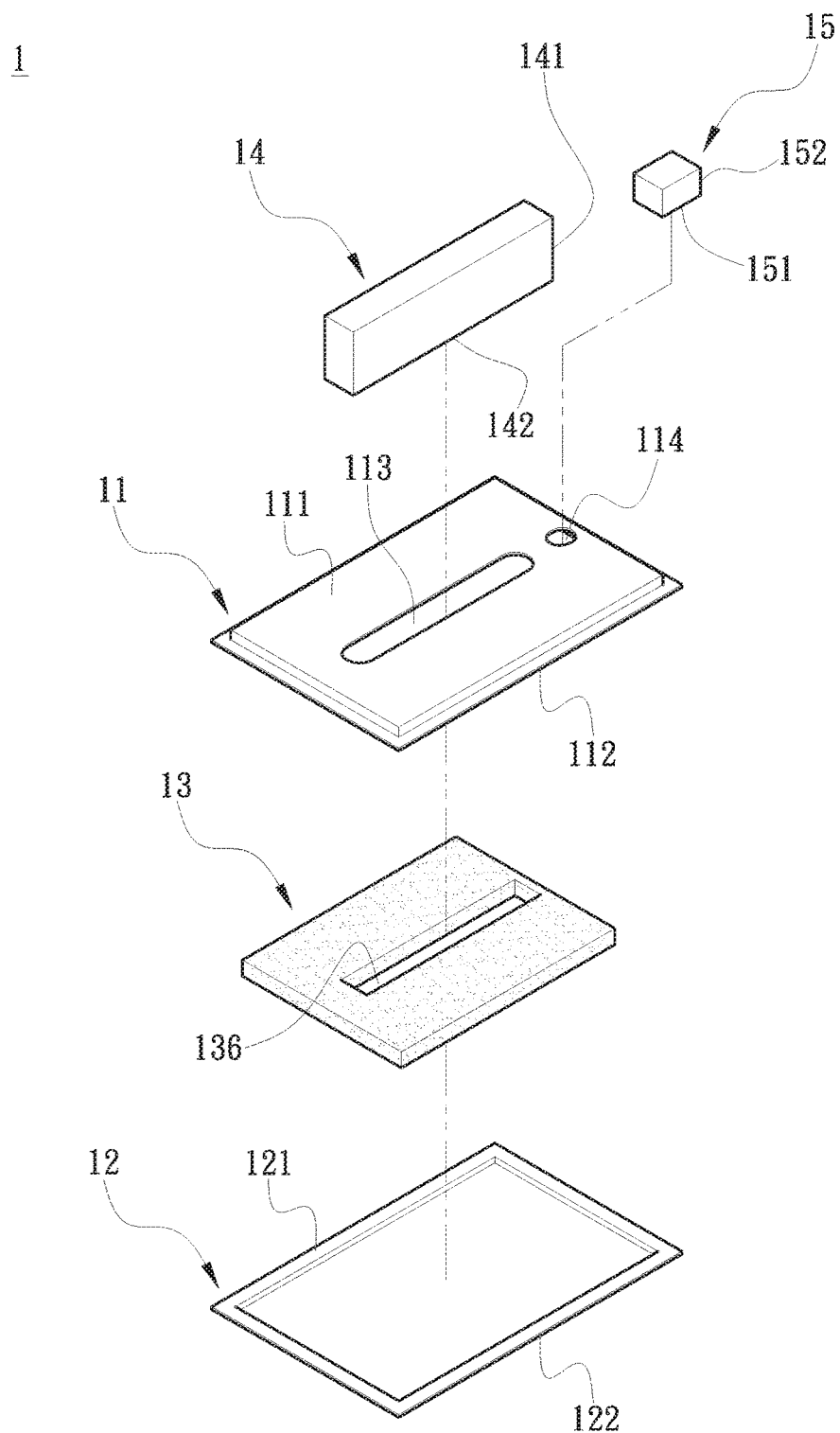
FIG. 4 is a perspective exploded view of a second embodiment of the vapor-phase/liquid-phase fluid heat exchange unit of the present invention.

Please now refer to FIG. 4, which is a perspective exploded view of a second embodiment of the vapor-phase/liquid-phase fluid heat exchange unit of the present invention. Also referring to FIGS. 1, 2 and 3, the second embodiment is partially identical to the first embodiment in structure and function and thus will not be redundantly described hereinafter. The second embodiment is different from the first embodiment in that the capillary structure is formed with a vapor space 136 corresponding to the vapor outlet 113. The vapor space 136 is in communication with the vapor outlet 113 and the evaporation section 161.

Accordingly, the evaporated working fluid 17 can be quickly vertically guided to the vapor outlet 113 so that the possibility that the evaporated working fluid 17 blocks the liquid inlet 114 is minimized.

Figure 5:
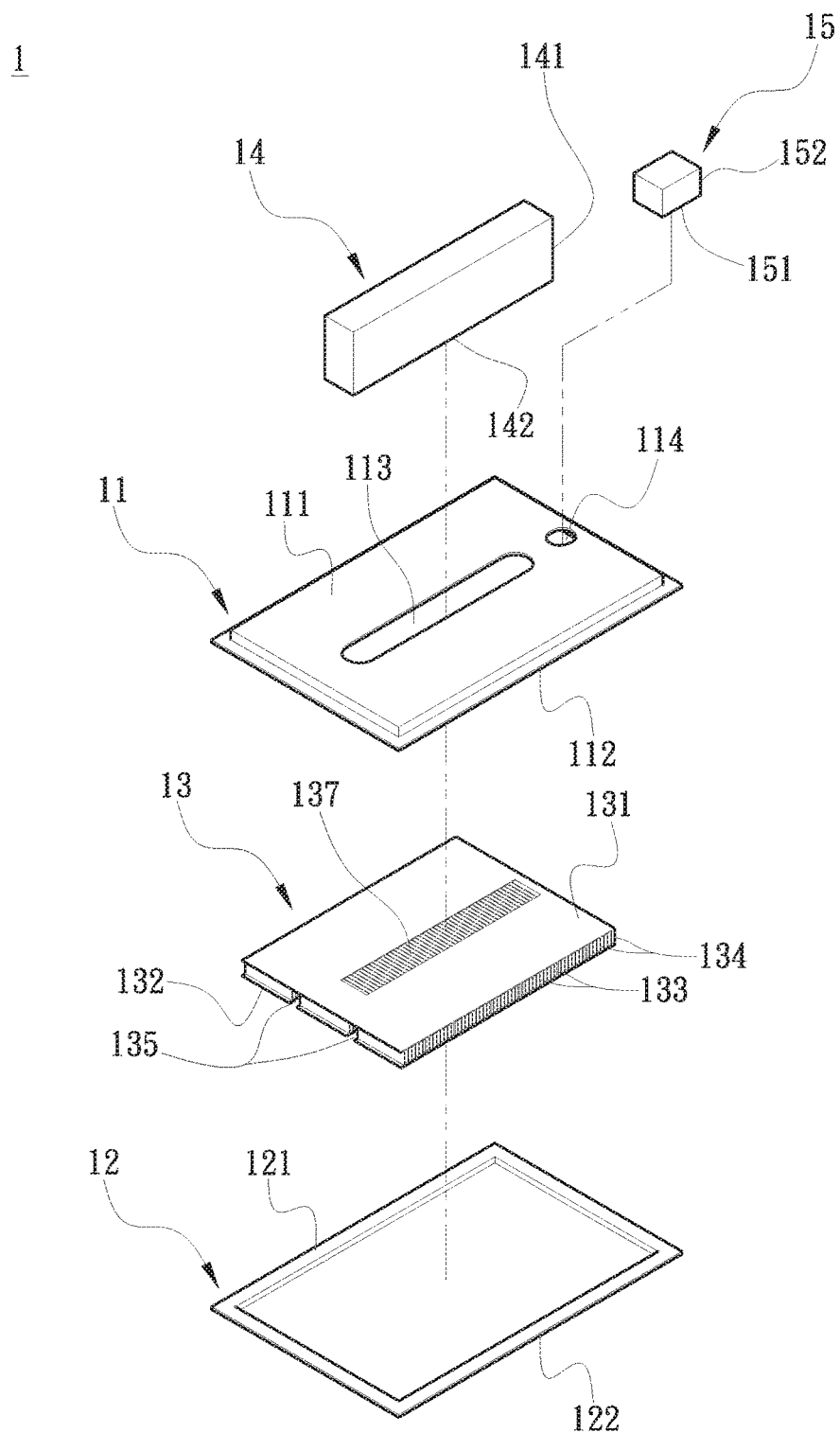
FIG. 5 is a perspective exploded view of a third embodiment of the vapor-phase/liquid-phase fluid heat exchange unit of the present invention.
Figure 6:
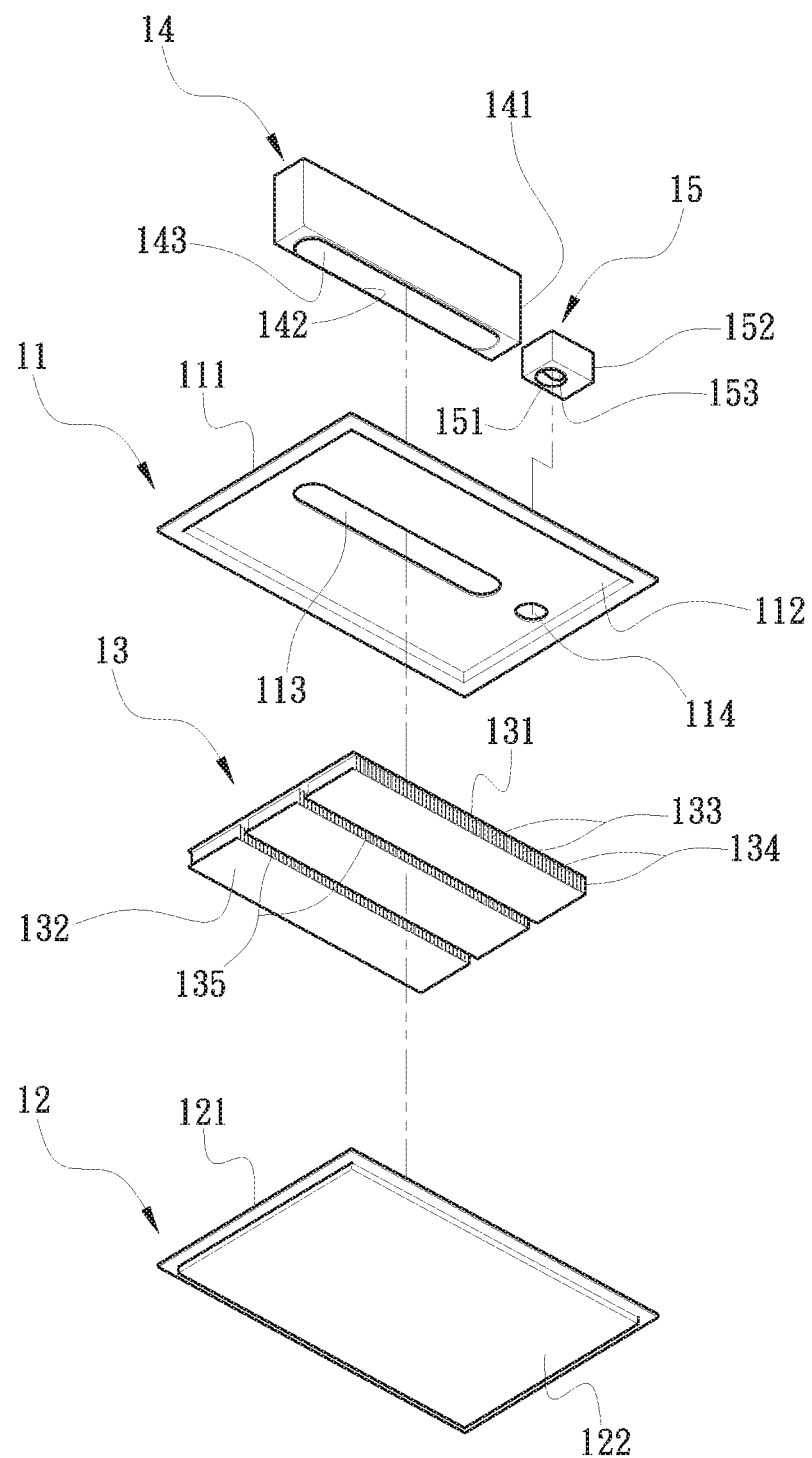
FIG. 6 is a perspective exploded view of the third embodiment of the vapor-phase/liquid-phase fluid heat exchange unit of the present invention, seen from another angle.
Figure 7:
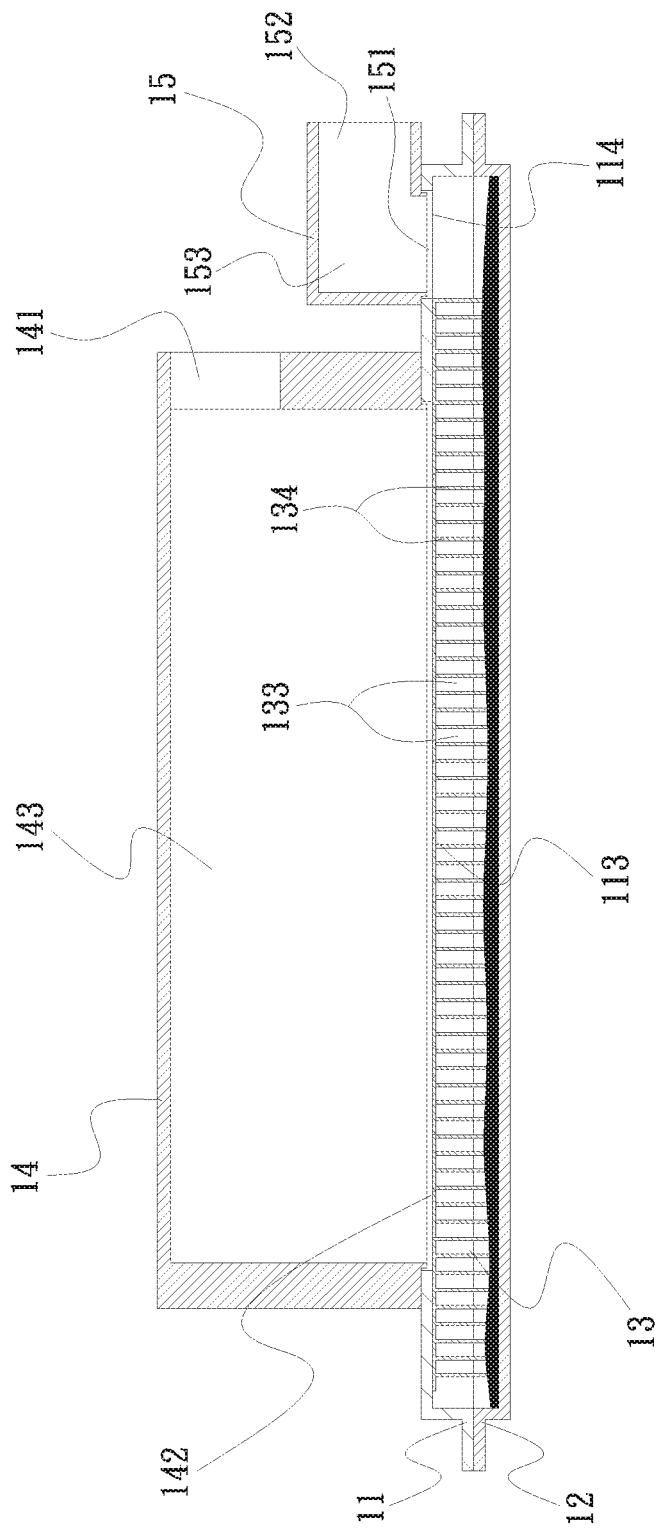
FIG. 7 is a sectional assembled view of the third embodiment of the vapor-phase/liquid-phase fluid heat exchange unit of the present invention.

Please now refer to FIGS. 5, 6 and 7. FIG. 5 is a perspective exploded view of a third embodiment of the vapor-phase/liquid-phase fluid heat exchange unit of the present invention. FIG. 6 is a perspective exploded view of the third embodiment of the vapor-phase/liquid-phase fluid heat exchange unit of the present invention, seen from another angle. FIG. 7 is a sectional assembled view of the third embodiment of the vapor-phase/liquid-phase fluid heat exchange unit of the present invention. Also referring to FIGS. 1, 2 and 3, the third embodiment is partially identical to the first embodiment in structure and function and thus will not be redundantly described hereinafter. The third embodiment is different from the first embodiment in that the fluid separation unit 13 is selectively a flow-guiding fin assembly. The flow-guiding fin assembly has an upper face 131, a lower face 132, multiple passages 133, multiple fins 134 and at least one channel 135.

The fin 134 has two vertical lateral sides. The adjacent lateral sides of the adjacent fins 134 are lap jointed or latched with each other to form the upper and lower faces 131, 132. Each two adjacent fins 134 define therebetween the passage 133. The upper face 131 is formed with an opening 137 corresponding to the vapor outlet 113 in communication with the passages 133 between the fins 134. The channel 135 is formed on the lower face 132 to pass through the fins 134 and the passages 133, whereby the backflow section 162 is in communication with the evaporation section 161. In this embodiment, there are, but not limited to, two channels 135. In a modified embodiment, the number of the channels 135 can be one or more than three. By means of the channels 135, the condensed working fluid 17 can quickly and uniformly flow into the passages 133. The fins 134 serve to increase the heat absorption rate of the working fluid 17.

Figure 8:
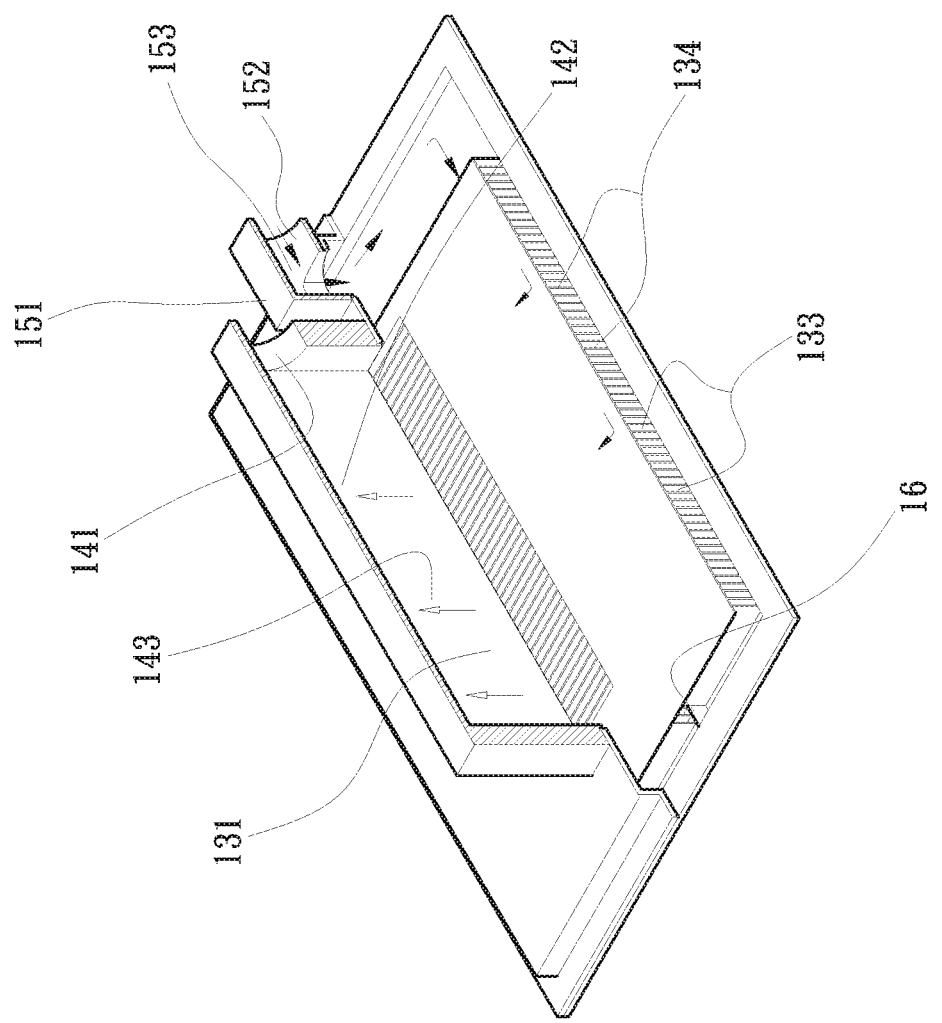
FIG. 8 is a partially sectional view of the third embodiment of the vapor-phase/liquid-phase fluid heat exchange unit of the present invention.

The upper face 131 and the fins 134 confine the direction of the opening 137. Therefore, the evaporated working fluid 17 can be quickly vertically guided to the vapor outlet 113 so that the possibility that the evaporated working fluid 17 blocks the liquid inlet 114 is minimized (as shown by the arrows of FIG. 8).

Figure 9:
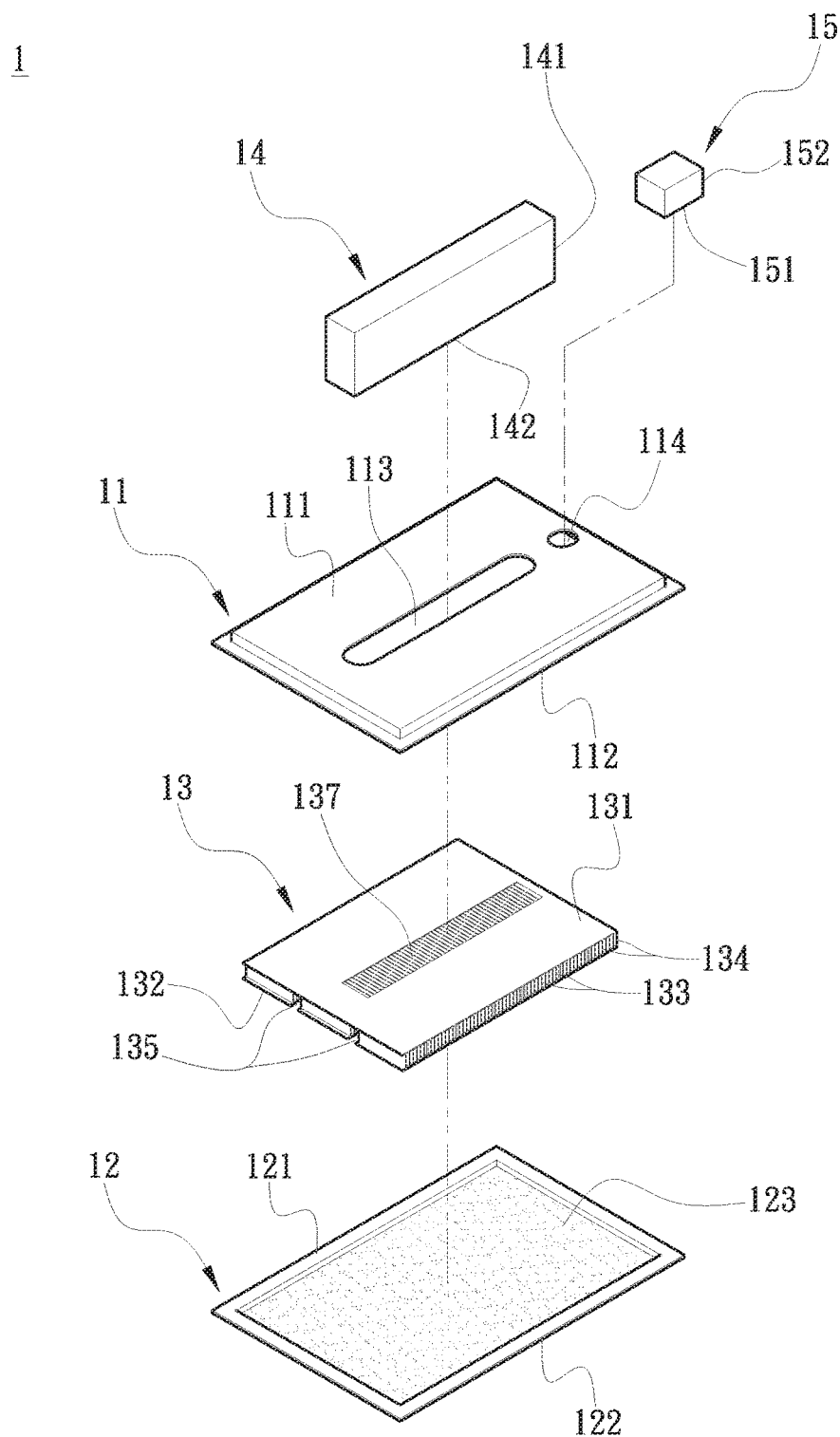
FIG. 9 is a perspective exploded view of a modified embodiment of the third embodiment of the vapor-phase/liquid-phase fluid heat exchange unit of the present invention.

In another modified embodiment, a capillary structure layer 123 is disposed on the third side 121 of the second cover body 12. The capillary structure layer 123 is disposed between the fluid separation unit 13 and the second cover body 12. The capillary structure layer 123 serves to make the condensed working fluid 17 quickly flow back the channels 135 and the passages 133 (as shown in FIG. 9).

Figure 10:
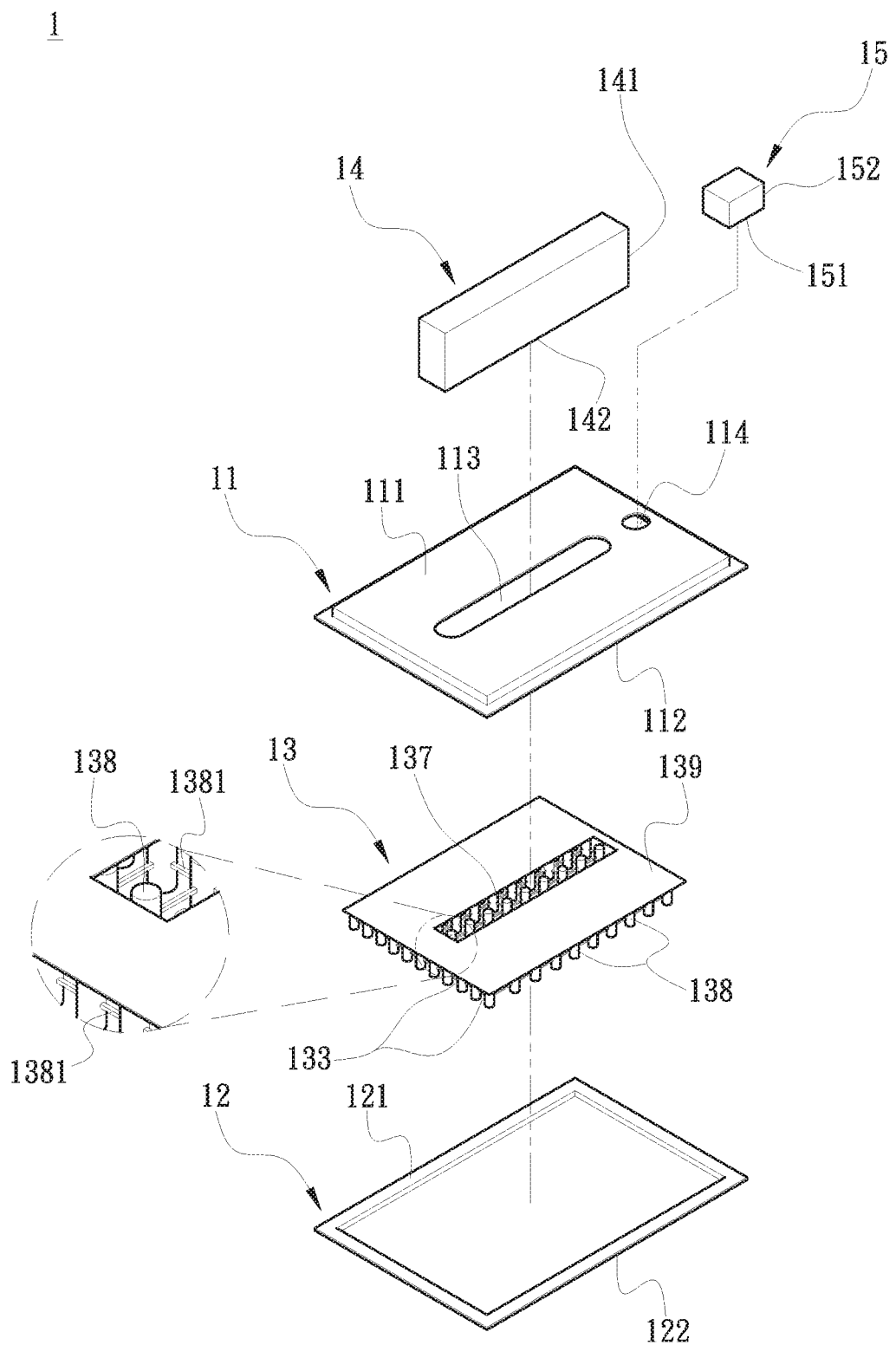
FIG. 10 is a perspective exploded view of another modified embodiment of the third embodiment of the vapor-phase/liquid-phase fluid heat exchange unit of the present invention.

In still another modified embodiment, the fluid separation unit 13 can be alternatively a flow-guiding fin column assembly (as shown in FIG. 10). The flow-guiding fin column assembly has an upper board 139, multiple passages 133 and multiple fin columns 138. The fin columns 138 are disposed on the upper board 139 to extend therefrom. The fin columns 138 define therebetween the passages 133. The upper board 131 is formed with an opening 137 in communication with the passages 133 and the fin columns 138. The fin columns 138 are directly formed on the upper board 139 or connected with each other by means of multiple connection bodies 1381. The backflow section 162 is in communication with the evaporation section 161 via the passages 133.

Figure 11:
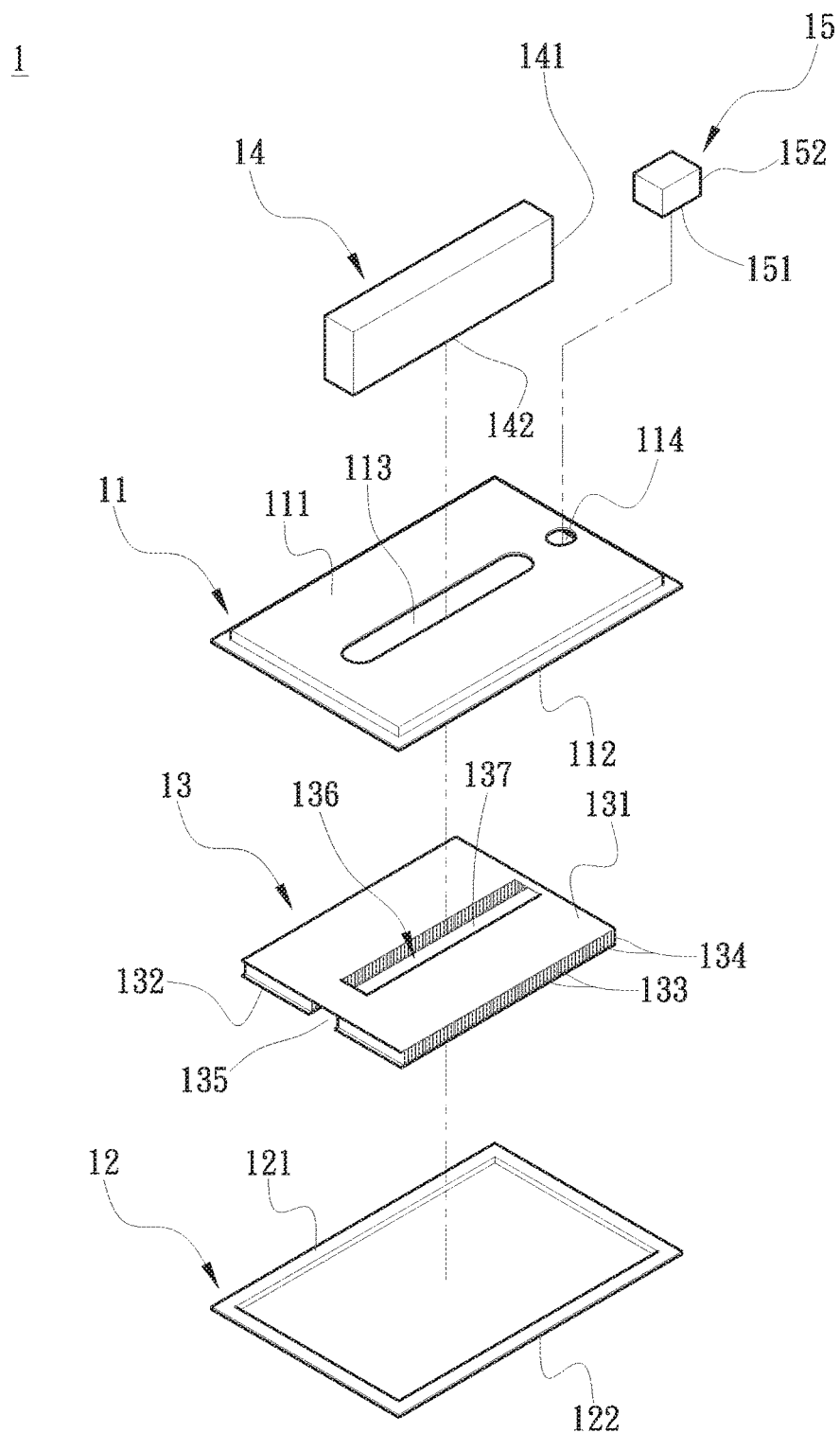
FIG. 11 is a perspective exploded view of a fourth embodiment of the vapor-phase/liquid-phase fluid heat exchange unit of the present invention.

Please refer to FIG. 11, which is a perspective exploded view of a fourth embodiment of the vapor-phase/liquid-phase fluid heat exchange unit of the present invention. Also referring to FIGS. 5 to 10, the fourth embodiment is partially identical to the third embodiment in structure and function and thus will not be redundantly described hereinafter. The fourth embodiment is different from the third embodiment in that the fins 134 are formed with a vapor space 136 corresponding to the opening 137. The vapor space 136 is in communication with the passages 133 and the opening 137 as well as the vapor outlet 113 and the evaporation section 161.

Figure 12:
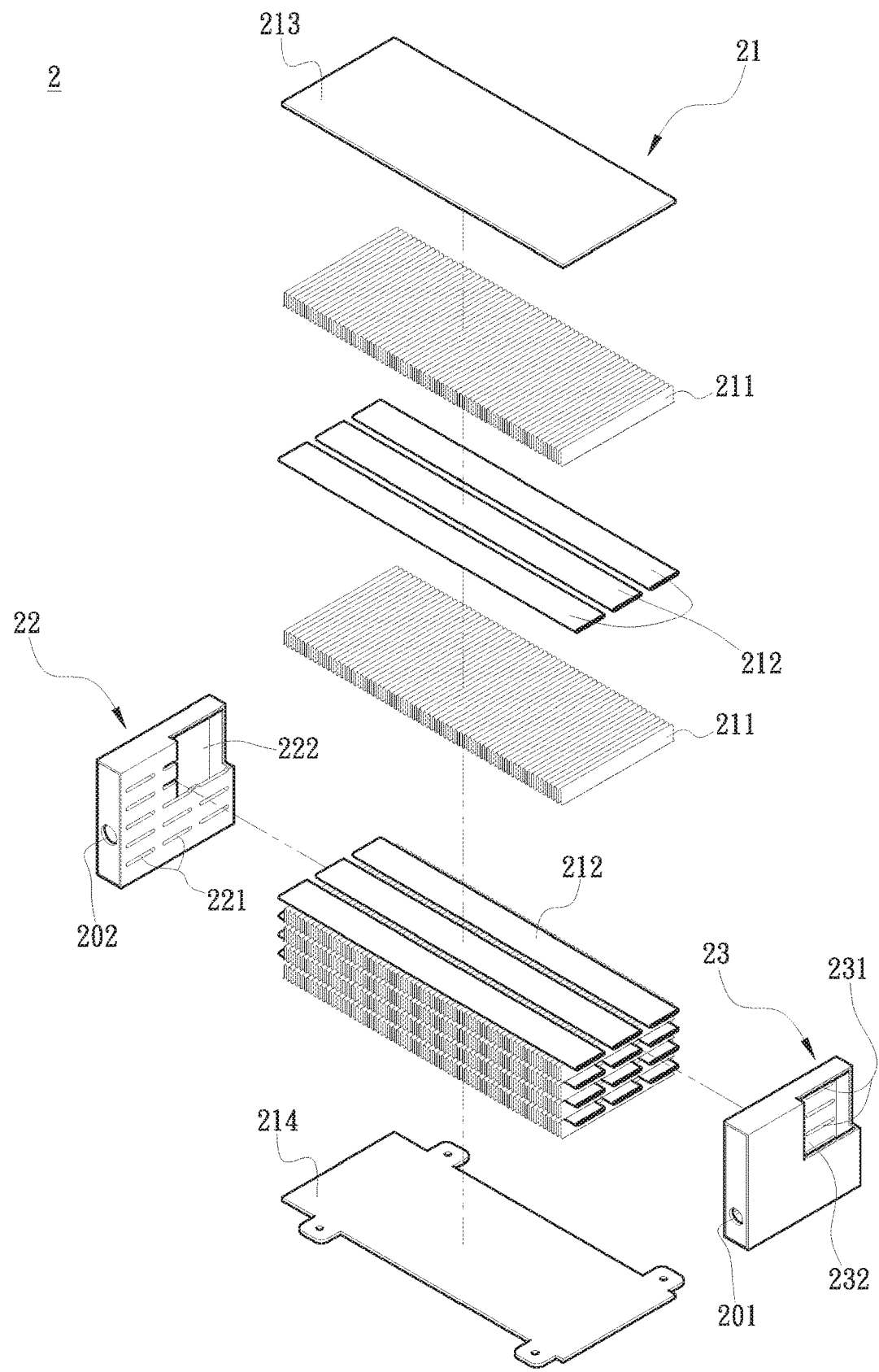
FIG. 12 is a perspective exploded view of the heat dissipation device of a fifth embodiment of the vapor-phase/liquid-phase fluid heat exchange unit of the present invention.
Figure 13:
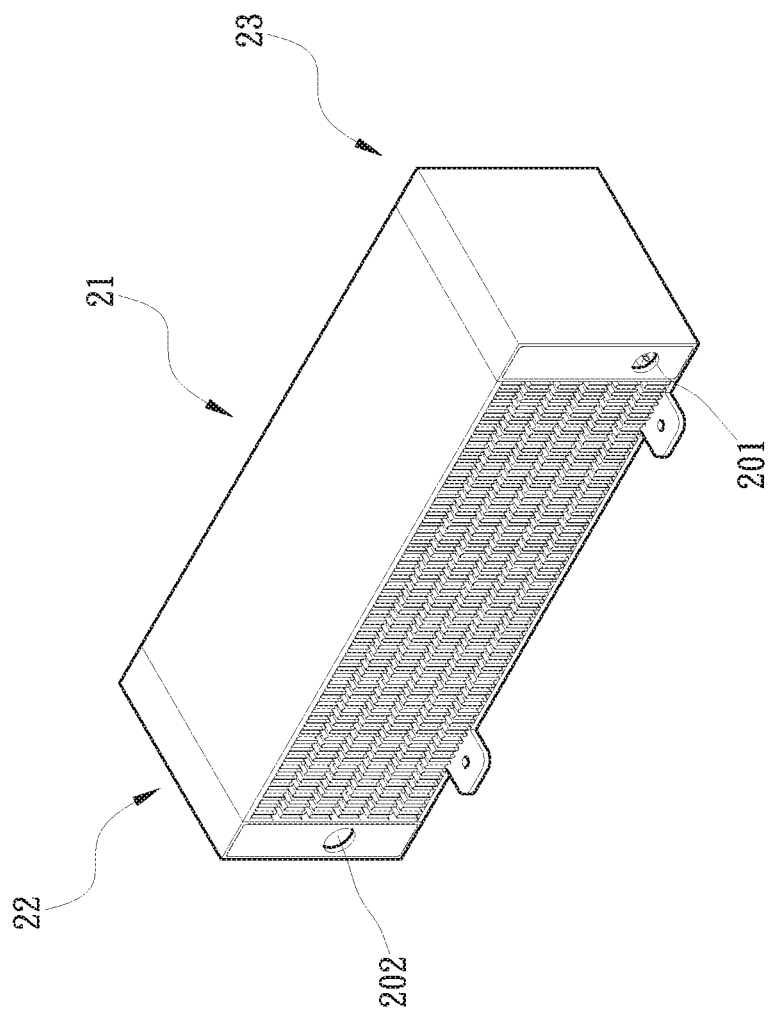
FIG. 13 is a perspective assembled view of the heat dissipation device of the fifth embodiment of the vapor-phase/liquid-phase fluid heat exchange unit of the present invention.
Figure 14:
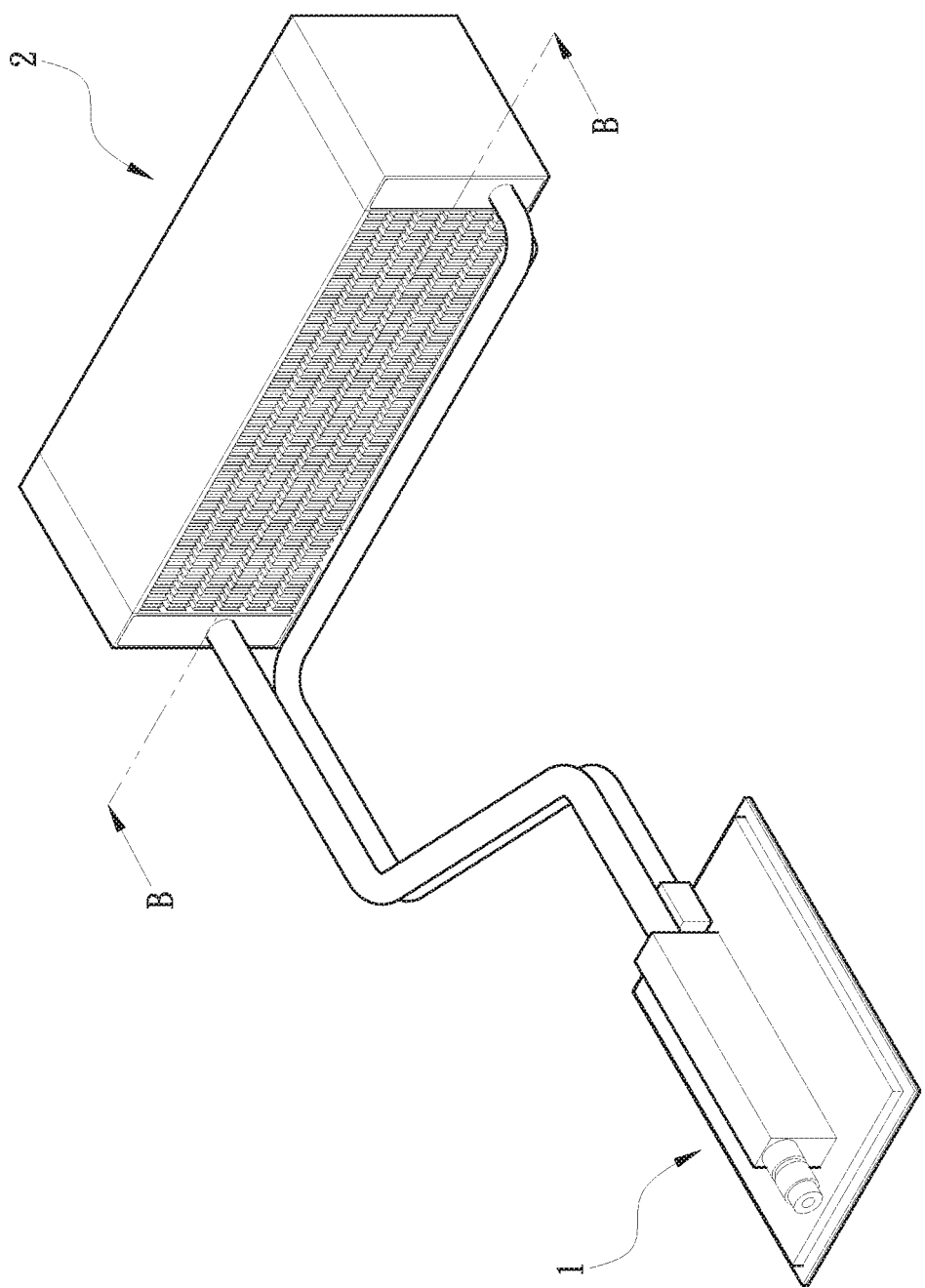
FIG. 14 is a perspective assembled view of the fifth embodiment of the vapor-phase/liquid-phase fluid heat exchange unit of the present invention.
Figure 15:
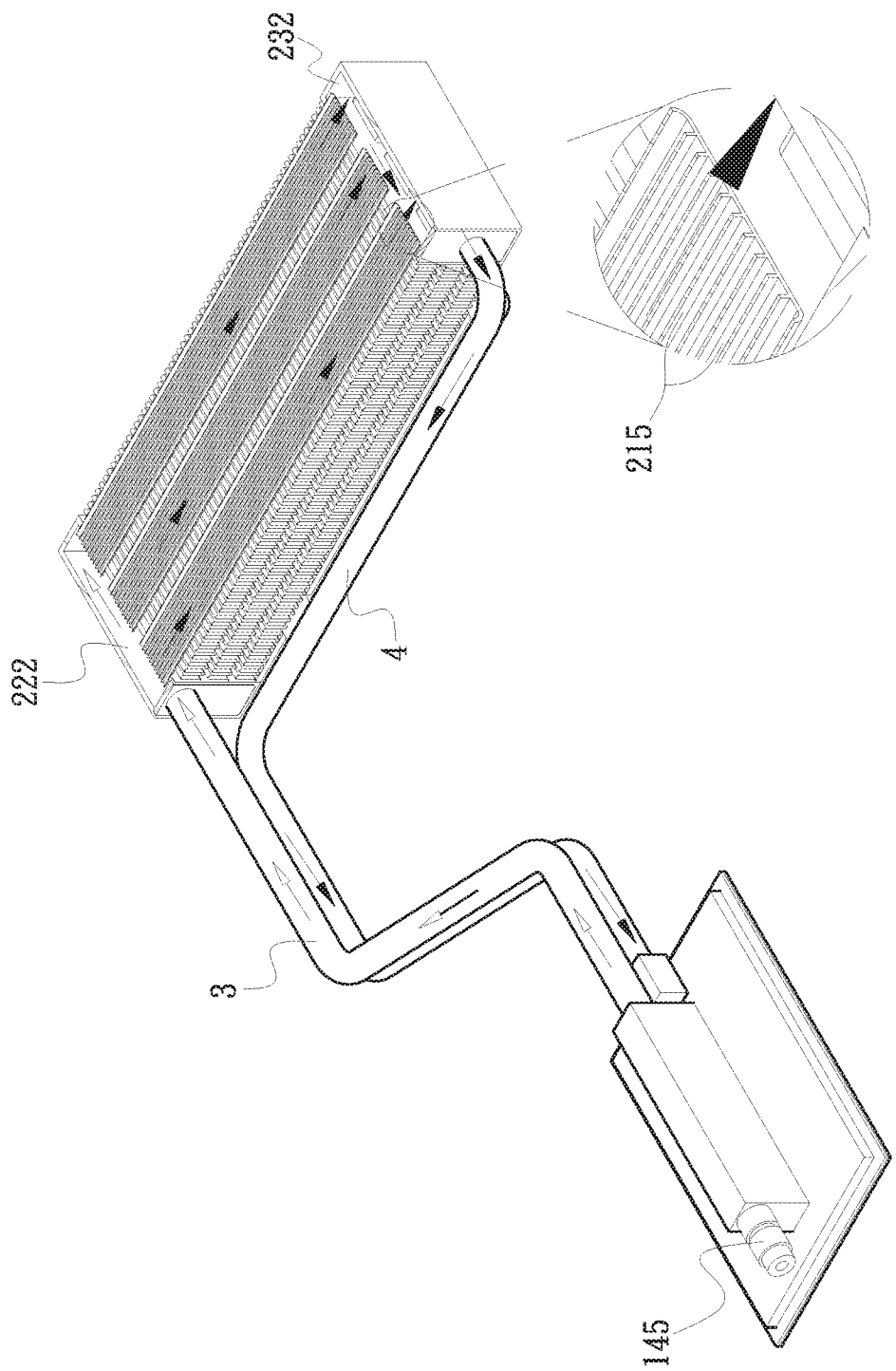
FIG. 15 is a partially sectional view of the fifth embodiment of the vapor-phase/liquid-phase fluid heat exchange unit of the present invention.

Please refer to FIGS. 12, 13, 14 and 15. FIG. 12 is a perspective exploded view of the heat dissipation device of a fifth embodiment of the vapor-phase/liquid-phase fluid heat exchange unit of the present invention. FIG. 13 is a perspective assembled view of the heat dissipation device of the fifth embodiment of the vapor-phase/liquid-phase fluid heat exchange unit of the present invention. FIG. 14 is a perspective assembled view of the fifth embodiment of the vapor-phase/liquid-phase fluid heat exchange unit of the present invention. FIG. 15 is a partially sectional view of the fifth embodiment of the vapor-phase/liquid-phase fluid heat exchange unit of the present invention. Also referring to FIGS. 1 to 11, the vapor-phase/liquid-phase fluid heat exchange device of the present invention has a vapor-phase/liquid-phase fluid heat exchange unit 1. The vapor-phase/liquid-phase fluid heat exchange unit 1 is connected with a heat dissipation device 2. The vapor-phase/liquid-phase fluid heat exchange unit 1 is partially identical to the first and second embodiments in structure and function and thus will not be redundantly described hereinafter. This embodiment is different from the first and second embodiments in that the heat dissipation device 2 has a heat dissipation device outlet 201 and a heat dissipation device inlet 202. The vapor outlet 113 is in communication with the heat dissipation device inlet 202 via a first tube body 3. The liquid inlet 114 is in communication with the heat dissipation device outlet 201 via a second tube body 4.

In this embodiment, the heat dissipation device 2 includes a condenser 21, a vapor collection connector 22 and a water collection connector 23. The condenser 21 has multiple radiating fin assemblies 211, which are stacked and arranged at intervals. Multiple pipelines 212 are side-by-side disposed between each two adjacent radiating fin assemblies 211. An upper protection board 213 is disposed on upper side of the condenser 21. A lower protection board 214 is disposed on lower side of the condenser 21.

The vapor collection connector 22 has multiple first perforations 221 and a vapor collection chamber 222. The heat dissipation device inlet 202 and the first perforations 221 respectively communicate the vapor collection chamber 222. FIG. 11 is a partially sectional view showing the vapor collection connector 22 for easy illustration.

The water collection connector 23 has multiple second perforations 231 and a water collection chamber 232. The heat dissipation device outlet 201 and the second perforations 231 respectively communicate the water collection chamber 232. FIG. 9 is a partially sectional view showing the water collection connector 23 for easy illustration. One end of the pipeline 212 is inserted in the first perforation 221 in communication with the vapor collection chamber 222. The other end of the pipeline 212 is inserted in the second perforation 231 in communication with the water collection chamber 232. Multiple sub-passages 215 are respectively disposed in the pipelines 212 in communication with the vapor collection chamber 222 and the water collection chamber 232.

In the direction shown by the arrows of FIG. 15, after the working fluid in the heat exchange space 16 absorbs to the heat of the heat source, the working fluid is evaporated and the evaporated working fluid passes through the vapor outlet 113 of the first cover body 11 and the first inlet 142 of the first connector 14 into the vapor outgoing chamber 143. Then the evaporated working fluid passes through the first outlet 141 to be transferred to the heat dissipation device 2 through the first tube body 3.

The evaporated working fluid passes through the heat dissipation device inlet 202 of the heat dissipation device 2 into the vapor collection chamber 222 of the vapor collection connector 22. Then, through the pipelines 212, the working fluid 17 is transferred to the water collection connector 23. When the working fluid 17 passes through the pipelines 212, the heat of the working fluid 17 is absorbed by the radiating fins 211 to radiate to external environment so as to achieve heat dissipation and cooling effect and condense the working fluid 17. The condensed working fluid 17 enters the water collection chamber 232 of the water collection connector 23. Then the condensed working fluid 17 passes through the heat dissipation device outlet 201 and is transferred through the second tube body 4 to the vapor-phase/liquid-phase fluid heat exchange unit 1.

The condensed working fluid 17 passes through the second inlet 152 of the second connector 15 of the vapor-phase/liquid-phase fluid heat exchange unit 1 into the backflow chamber 153. Then the condensed working fluid 17 passes through the second outlet 151 and the liquid inlet 114 of the first cover body 111 into the heat exchange space 16. Accordingly, by means of the difference between the high pressure and low pressure of the evaporated working fluid and the condensed working fluid, the working fluid is driven to continuously circulate.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A vapor-phase/liquid-phase fluid heat exchange unit comprising:
    a first cover body having a first side, a second side, a vapor outlet and a liquid inlet, the first side and the second side being respectively positioned on an upper side and a lower side of the first cover body, the vapor outlet and the liquid inlet being on the first cover body and penetrated from the first side to the second side;
    a second cover body having a third side and a fourth side, the first and second cover bodies being correspondingly mated with each other to together define a heat exchange space in which a working fluid is filled;
    a fluid separation unit being a capillary structure and disposed in the heat exchange space, the fluid separation unit occupying a portion of an area of the heat exchange space less than an area of the entire heat exchange space, thereby partitioning the heat exchange space into an evaporation section corresponding to the vapor outlet of the first cover body and a backflow section corresponding to the liquid inlet of the first cover body, wherein the portion of the area of the heat exchange space occupied by the fluid separation unit serves as the evaporation section, leaving the remaining area as the backflow section;
    a first connector connected with the first side of the first cover body or integrally formed with the first side of the first cover body, the first connector having a first outlet, a first inlet and a vapor outgoing chamber, the first outlet and the first inlet being respectively in communication with the vapor outgoing chamber, the first inlet being located above the evaporation section and correspondingly in communication with the vapor outlet;
    a second connector connected with the first side of the first cover body or integrally formed with the first side of the first cover body, the second connector having a second outlet, a second inlet and a backflow chamber, the second outlet and the second inlet being respectively in communication with the backflow chamber, the second outlet being located above the backflow section and correspondingly in communication with the liquid inlet; and
    by means of the fluid separation unit to partition working fluid in the evaporation section and the backflow section, the working fluid flowing out from the vapor outlet above the evaporation section and flowing into the backflow section from the liquid inlet, respectively, to achieve a vapor-liquid separation without hindering each other.

2. The vapor-phase/liquid-phase fluid heat exchange unit as claimed in claim 1, wherein the capillary structure is formed with a vapor space corresponding to the vapor outlet, the vapor space being in communication with the vapor outlet and the evaporation section.

3. The vapor-phase/liquid-phase fluid heat exchange unit as claimed in claim 1, wherein the fluid separation unit is a flow-guiding fin assembly, the flow-guiding fin assembly having an upper face, a lower face, multiple passages, multiple fins and at least one channel, each fin having two vertical lateral sides, the adjacent lateral sides of the adjacent fins being lap jointed or latched with each other to form the upper and lower faces, each two adjacent fins defining therebetween the passage, the upper face being formed with an opening corresponding to the vapor outlet in communication with the passages between the fins, the channel being formed on the lower face to pass through the fins and the passages, whereby the backflow section is in communication with the evaporation section.

4. The vapor-phase/liquid-phase fluid heat exchange unit as claimed in claim 3, wherein the fins are formed with a vapor space corresponding to the opening, the vapor space being in communication with the passages and the opening as well as the vapor outlet and the evaporation section.

5. The vapor-phase/liquid-phase fluid heat exchange unit as claimed in claim 3, further comprising a capillary structure layer disposed between the third side of the second cover body and lower side of the fluid separation unit.

6. The vapor-phase/liquid-phase fluid heat exchange unit as claimed in claim 3, wherein the fluid separation unit is a flow-guiding fin column assembly, the flow-guiding fin column assembly having an upper board, multiple passages and multiple fin columns, the fin columns being disposed on the upper board to extend therefrom, the fin columns defining therebetween the passages, the upper board being formed with an opening in communication with the passages and the fin columns, the backflow section being in communication with the evaporation section via the passages.

7. The vapor-phase/liquid-phase fluid heat exchange unit as claimed in claim 1, wherein the vapor-phase/liquid-phase fluid heat exchange unit is further connected with a heat dissipation device, the heat dissipation device having a heat dissipation device outlet and a heat dissipation device inlet, the vapor outlet being in communication with the heat dissipation device inlet via a first tube body, the liquid inlet being in communication with the heat dissipation device outlet via a second tube body.

\* \* \* \* \*